(12) United States Patent
Nishikawa

(10) Patent No.: US 7,514,963 B2
(45) Date of Patent: Apr. 7, 2009

(54) SEMICONDUCTOR INTEGRATED CIRCUIT DEVICE

(75) Inventor: Hidetoshi Nishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/561,552

(22) PCT Filed: Jun. 21, 2004

(86) PCT No.: PCT/JP2004/009059

§ 371 (c)(1),
(2), (4) Date: Mar. 20, 2006

(87) PCT Pub. No.: WO2004/114523

PCT Pub. Date: Dec. 29, 2004

(65) Prior Publication Data

US 2006/0158921 A1    Jul. 20, 2006

(30) Foreign Application Priority Data

Jun. 23, 2003   (JP)   ............................... 2003-177412

(51) Int. Cl.
    *H03K 19/0175*  (2006.01)
(52) U.S. Cl. ........................... 326/83; 326/27; 326/113; 327/170
(58) Field of Classification Search ................. 326/27, 326/83, 87; 327/170
    See application file for complete search history.

(56) References Cited

U.S. PATENT DOCUMENTS

| | | | |
|---|---|---|---|
| 5,218,239 A * | 6/1993 | Boomer | ......................... 326/27 |
| 5,285,119 A | 2/1994 | Takahashi | |
| 5,455,534 A | 10/1995 | Motegi et al. | |
| 5,966,407 A | 10/1999 | Hiraki et al. | |
| 6,160,416 A * | 12/2000 | Adduci et al. | .................. 326/21 |
| 6,320,407 B1 * | 11/2001 | Sakamoto | ..................... 326/27 |
| 6,489,807 B2 * | 12/2002 | Genna et al. | ................... 326/56 |
| 2003/0025541 A1 * | 2/2003 | Humphrey et al. | ........... 327/170 |

FOREIGN PATENT DOCUMENTS

| | | |
|---|---|---|
| JP | 4-324381 | 11/1992 |
| JP | 05-090942 | 4/1993 |
| JP | 5-191241 | 7/1993 |
| JP | 5-224621 | 9/1993 |
| JP | 06-061828 | 3/1994 |
| JP | 6-268506 | 9/1994 |
| JP | 6-296129 | 10/1994 |

(Continued)

*Primary Examiner*—Vibol Tan
(74) *Attorney, Agent, or Firm*—Fish & Richardson P.C.

(57) ABSTRACT

When the operation frequency is high, in order to cause the rate of change of outputs from an output terminal (OUT) to be abrupt, a selection control signal is caused to be in a low state, thereby causing MOS transistors (T5b, T6b) to be in ON states, thereby causing the combined resistance of the ON-resistances of the MOS resistors in a NOR gate (NOx) to be small. On the other hand, when the operation frequency is low, in order to cause the rate of change of outputs from the output terminal (OUT) to be gentle, the selection control signal is caused to be in a high state, thereby causing the MOS transistors (T5b, T6b) to be in OFF states, thereby causing the combined resistance of the ON-resistances of the MOS transistors in the NOR gate (NOx) to be large.

15 Claims, 15 Drawing Sheets

FOREIGN PATENT DOCUMENTS

| | | |
|---|---|---|
| JP | 7-79146 | 3/1995 |
| JP | 8-97693 | 4/1996 |
| JP | 9-93116 | 4/1997 |
| JP | 10-91255 | 4/1998 |
| JP | 11-3157 | 1/1999 |
| JP | 2001-119277 | 4/2001 |

* cited by examiner

US 7,514,963 B2

SEMICONDUCTOR INTEGRATED CIRCUIT DEVICE

TECHNICAL FIELD

The present invention relates to a semiconductor integrated circuit device constituting an output buffer circuit, and more particularly to a semiconductor integrated circuit device constituting an output buffer circuit that can perform switching according to the operating clock frequency.

BACKGROUND ART

Conventionally used output buffer circuits are, for example, as shown in FIG. 9, provided with a NOR gate NO that receives a data signal (in this figure, DATA) and an enable signal (in this figured, ENL), and an N channel MOS transistor Tx having its gate connected to the output of the NOR gate NO, its source grounded, and its drain fitted with an output terminal OUT. When such an output buffer circuit is used in a thermal print head, there is provided, as shown in FIG. 9, a heater resistance R that is connected, at one end thereof, to the output terminal OUT and receives, at the other end thereof, a voltage VH applied thereto.

The NOR gate NO in this output buffer circuit is configured as shown in FIG. 10. Specifically, there are provided a P channel MOS transistor T1 receiving a power supply voltage VDD applied to its source and receiving an enable signal at its gate, a P channel MOS transistor T2 having its source connected to the drain of the MOS transistor T1 and receiving a data signal at its gate, a MOS transistor T3 having its source grounded and receiving a data signal at its gate, and a MOS transistor T4 having its source grounded and receiving an enable signal at its gate. The drains of the MOS transistors T3 and T4 are connected to the drain of the MOS transistor T2, and the node at which the drains of the MOS transistors T2 to T4 are connected together serves as the output end and is connected to the gate of the MOS transistor Tx.

In this output buffer circuit, the gradient of voltage change appearing in the output terminal OUT varies depending on the gate capacitance of the gate of the MOS transistor Tx serving as a driver and the on-state resistances of the MOS transistors T1, T2, and T4. Specifically, the rate of voltage change appearing in the output terminal OUT becomes higher when the composite resistance of the on-state resistances of the MOS transistors T1 and T2 and the on-state resistance of the MOS transistor T4 are made lower, and it becomes lower when the composite resistance of the on-state resistances of the MOS transistors T1 and T2 and the on-state resistance of the MOS transistor T4 are made higher. In this way, by varying the magnitudes of the on-state resistances of the MOS transistors T1, T2, and T4 provided in the NOR gate NO, it is possible to adjust the gradient of the voltage change appearing in the output terminal OUT. This makes it possible to build an output buffer circuit that operates at an operation frequency at which to handle a data signal and an enable signal.

Moreover, as a conventional technique, there has been proposed an output buffer circuit that makes, by turning on the transistors having different on-state resistances and connected in parallel at different times to return an output, the output vary gently, and then changes the output sharply, and in addition adjusts times at which to switch the rate of output change by varying a threshold value of an inverter circuit that receives the returned output (see Japanese Patent Application Laid-Open No. 2001-292056). This output buffer circuit is provided with a buffer that delays a signal inputted from an input terminal VIN and an inverter that returns a signal outputted from an output terminal VOUT, and turns on/off the MOS transistor having low on-state resistance according to the output of the NAND gate that receives the outputs of the buffer and the inverter.

With this configuration, when the output from the output buffer circuit varies, there appears first a sharp change, then a signal delayed by the buffer is fed, and then the MOS transistor having low on-state resistance is turned off. This makes the output vary gently. Thereafter, when the output from the output terminal VOUT exceeds the threshold value of the inverter, the output from the inverter varies, turning on the MOS transistor having low on-state resistance. This makes the output vary sharply. That is, by adjusting the threshold value of the inverter, it is possible to change the length of time the output varies sharply. This makes it possible to build an output buffer circuit that operates at an operation frequency.

However, in the output buffer circuit configured as shown in FIG. 9 and the output buffer circuit disclosed in Patent Document 1, it is necessary to change the on-state resistances of the MOS transistors T1 and T4 provided in the NOR gate NO and the threshold value of the inverter according to the operation frequency at which the output buffer circuit operates. That is, in either case, the output buffer circuits are so configured as to operate at a predetermined operation frequency, and thus cannot be offered as a general-purpose output buffer. To solve this problem, conventionally, as shown in FIG. 11, NOR gates NO1 and NO2 are used that are configured as shown in FIG. 10 and provided with the MOS transistors T1 and T4 having different on-state resistances, making the operation frequency range wider.

Specifically, the output buffer circuit shown in FIG. 11 is provided with a transistor switch S1 that selects an output from the NOR gate NO1 in which the MOS transistors T1 and T4 have high on-state resistances, and a transistor switch S2 that selects an output from the NOR gate NO2 in which the MOS transistors T1 and T4 have low on-state resistances. A selection control signal for selecting one among the outputs from the NOR gates NO1 and NO2 is fed to the gate of the transistor switches S1 and S2, and then the output from the NOR gate NO1 or NO2 is inputted, via the transistor switches S1 and S2, to the gate of the MOS transistor Tx. The transistor switches S1 and S2 are each composed, as shown in FIG. 12, of an N channel MOS transistor Tn and a P channel MOS transistor To connected in parallel.

The selection control signal is inputted to the gate of the N channel MOS transistor Tn of the transistor switch S1 and to the gate of the P channel MOS transistor Tp of the transistor switch S2. Moreover, the selection control signal is inverted by the inverter Ix, and is then inputted to the gate of the P channel MOS transistor Tp of the transistor switch S1 and to the gate of the N channel MOS transistor Tn of the transistor switch S2.

When the operation frequency is low, the selection control signal is turned to a high level and the transistor switch S1 is turned on, whereby the output from the NOR gate NO1 is fed to the gate of the MOS transistor Tx. On the other hand, when the operation frequency is high, the selection control signal is turned to a low level and the transistor switch S2 is turned on, whereby the output from the NOR gate NO2 is fed to the gate of the MOS transistor Tx. In this way, with the configuration shown in FIG. 11, it is possible to build an output buffer circuit that easily varies an output according to the operation frequency by switching the selection control signal from one level to another.

However, when the output buffer circuit is configured as shown in FIG. 11, it is provided with the NOR gates NO1 and NO2 and the transistor switches S1 and S2, resulting in an increased size of the output buffer circuit compared with that of the output buffer circuit shown in FIG. 9 or disclosed in Patent Document 1. This makes it difficult to make smaller a semiconductor integrated circuit device provided with such an output buffer circuit. Furthermore, in a thermal print head or the like provided with such a semiconductor integrated circuit device, the number of output buffer circuits is determined according to the number of print bits. Thus, the device size is further increased by a factor of the number of print bits.

DISCLOSURE OF THE INVENTION

It is an object of the present invention to provide a semiconductor integrated circuit device provided with an output buffer circuit that can easily vary the rate of output change according to the operation frequency and in addition achieve size reduction.

To achieve the above object, according to one aspect of the present invention, in a semiconductor integrated circuit device having an output buffer circuit composed of a logic gate that receives data and a driver transistor that receives, at a control electrode thereof, an output from the logic gate and that is driven according to the output from the logic gate, the logic gate receives a selection control signal that varies the magnitude of the composite resistance of an on-state resistance of a transistor constituting the logic gate, and has a resistance value switching transistor that can be switched on/off by the selection control signal, and the resistance value switching transistor is switched on/off by the selection control signal to switch the rate of change of an output of the driver output transistor.

According to another aspect of the present invention, in a semiconductor integrated circuit device having an output buffer circuit composed of a logic gate that receives data and a driver transistor that receives, at a control electrode thereof, an output from the logic gate and that is driven according to the output from the logic gate, there are provided, within the output buffer circuit, a plurality of transistor switches that have different on-state resistances and that are connected between the output of the logic gate and the control electrode of the driver transistor, and one of the plurality of second transistor switches is turned on to switch the rate of change of an output of the driver output transistor.

BEST MODE FOR CARRYING OUT THE INVENTION

First Embodiment

Figure 1:
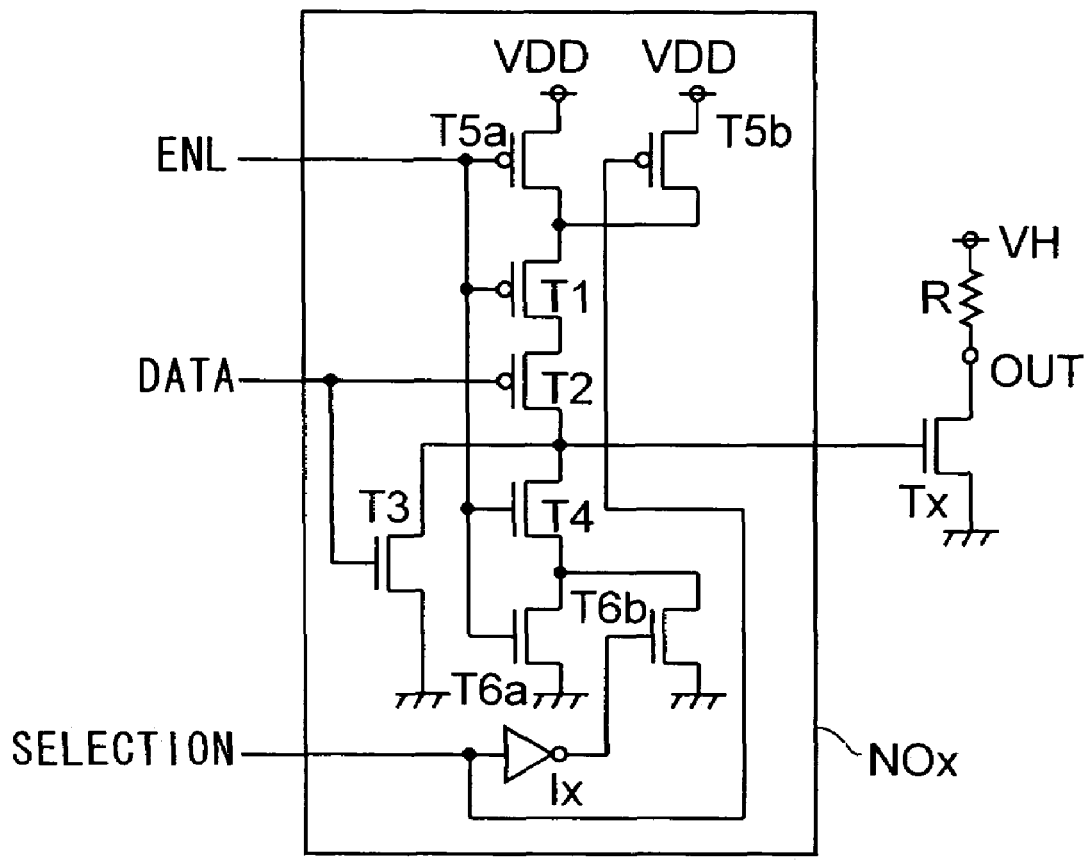
FIG. 1 is a circuit diagram showing the configuration of the output buffer circuit of a first embodiment.
Figure 2:
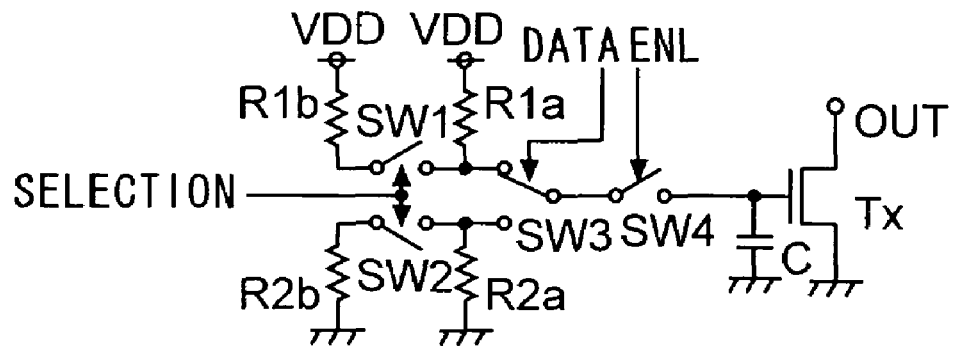
FIG. 2 is a circuit diagram showing the equivalent circuit of the output buffer circuit of FIG. 1.

A first embodiment of the present invention will be described with reference to the accompanying drawings. FIG. 1 is a circuit diagram showing the configuration of the output buffer circuit of this embodiment, and FIG. 2 is a circuit diagram showing the equivalent circuit of the output buffer circuit of FIG. 1.

The output buffer circuit of FIG. 1 is provided with a NOR gate NOx composed of P channel MOS transistors T1 and T5a and N channel MOS transistors T4 and T6a that receive an enable signal (in this figure, ENL) at their gates, a P channel MOS transistor T2 and an N channel MOS transistor T3 that receive a data signal (in this figure, DATA) at their gates, a P channel MOS transistor T5b that receives a selection control signal at its gate, an N channel MOS transistor T6b that receives at its gate a selection control signal inverted by an inverter Ix, and the inverter Ix. This NOR gate NOx receives the enable signal and the data signal, and in addition has its composite resistance varied by the selection control signal. Moreover, the output buffer circuit of FIG. 1 is provided with an N channel MOS transistor Tx having its gate connected to the output of the NOR gate NOx and serving as a driver.

Furthermore, the MOS transistors T5a and T5b receive a direct-current voltage VDD (a power supply voltage) at their sources, and in addition have their drains connected to the source of the MOS transistor T1. Furthermore, the source of the MOS transistor T2 is connected to the drain of the MOS transistor T1. On the other hand, the MOS transistors T3, T6a, and T6b have theirs sources grounded, and the MOS transistors T6a and T6b have their drains connected to the source of the MOS transistor T4. Furthermore, the drain of the MOS transistor T2 is connected to the drains of the MOS transistors T3 and T4.

The node at which the drains of the MOS transistors T2 to T4 are connected together serves as the output end of the NOR gate NOx, and is connected to the gate of the MOS transistor Tx. This MOS transistor Tx has its source grounded and its drain fitted with an output terminal OUT. Furthermore, when such an output buffer circuit is used in a thermal print head, there is provided a heater resistance R that is connected, at one end thereof, to the output terminal OUT and receives, at the other end thereof, a voltage VH applied thereto.

Moreover, the MOS transistors T1 to T4, T5a, T5b, T6a, and T6b are set so that the on-state resistance of the MOS transistors T5a and T6a is made higher than the on-state resistance of the MOS transistors T1 to T4, T5b, and T6b. That is, they may be set so that the gate width of the MOS transistors T5a and T6a is made narrower than that of the MOS transistors T1 to T4, T5b, and T6b. Alternatively, they may be set so that the gate length of the MOS transistors T5a and T6a is made longer than that of the MOS transistors T1 to T4, T5b, and T6b.

In this output buffer circuit, switching control is performed to turn on/off the MOS transistors T5b and T6b by switching the selection control signal from one level to another. Specifically, when the selection control signal takes a low level, the MOS transistor T5b that receives a low level selection control signal at its gate is turned on, and the MOS transistor T6b that receives at its gate a selection control signal inverted to a high level by the inverter Ix is turned on. On the other hand, when the selection control signal takes a high level, the MOS transistor T5b that receives a high level selection control signal at its gate is turned off, and the MOS transistor T6b that receives at its gate a selection control signal inverted into a low level by the inverter Ix is turned off.

Moreover, since the MOS transistors T5a and T5b are connected in parallel, the composite resistance of the on-state resistances of the MOS transistors T1, T5a, and T5b obtained when the MOS transistor T5b is turned on is lower than the composite resistance of the on-state resistances of the MOS transistors T1 and T5a obtained when the MOS transistor T5b is turned off. Similarly, since the MOS transistors T6a and T6b are connected in parallel, the composite resistance of the on-state resistances of the MOS transistors T4, T6a, and T6b obtained when the MOS transistor T6b is turned on is lower than the composite resistance of the on-state resistances of the MOS transistors T4 and T6a obtained when the MOS transistor T6b is turned off.

Specifically, when the operation frequency is low, the output buffer circuit of FIG. 1 operates in the following manner to cause the gate voltage of the MOS transistor Tx serving as a driver to vary gently. The output buffer circuit makes higher the composite resistance of the on-state resistances of the MOS transistors provided in the NOR gate NOx by making the selection control signal take a high level and thus turning off the MOS transistors T5b and T6b. At this time, if a low level data signal is fed, when the enable signal is turned to a low level and then output from the driver is enabled, the MOS transistors T1, T2, and T5a are in an on state and the MOS transistors T3, T4, and T6a are in an off state. This makes the gate voltage of the MOS transistor Tx increase gently, because the amount of current flowing, via the composite resistance of the on-state resistances of the MOS transistors T1, T2, and T5a, through the gate capacitance C of the MOS transistor Tx serving as a driver is small, and thus makes the amount of current flowing through the resistance R increase gently.

Moreover, when the enable signal is turned to a high level again after it is maintained at a low level for a predetermined time, the output is disabled. At this time, the MOS transistors T1 and T5a are turned off and the MOS transistors T4 and T6a are turned on. This makes the gate voltage of the MOS transistor Tx decrease gently, because the amount of current flowing, via the composite resistance of the on-state resistances of the MOS transistors T4 and T6a, from the gate capacitance C of the MOS transistor Tx is small, and thus makes the amount of current flowing through the resistance R decrease gently. Moreover, when the data signal takes a high level, the MOS transistor T2 is in an off state and the MOS transistor T3 is in an on state. This makes the gate voltage of the MSO transistor Tx remain at a low level, whereby no current flows through the resistance R.

On the other hand, when the operation frequency is high, the output buffer circuit operates in the following manner to cause the gate voltage of the MOS transistor Tx serving as a driver to vary sharply. The output buffer circuit makes lower the composite resistance of the on-state resistances of the MOS transistors provided in the NOR gate NOx by making the selection control signal take a low level and thus turning on the MOS transistors T5b and T6b. At this time, if a low level data signal is fed, when the enable signal is turned to a low level and then output from the driver is enabled, the MOS transistors T1, T2, T5a, T5b, and T6b are in an on state and the MOS transistors T3, T4, and T6a are in an off state. This makes the gate voltage of the MOS transistor Tx increase sharply, because the amount of current flowing, via the composite resistance of the on-state resistances of the MOS transistors T1, T2, T5a, and T5b, through the gate capacitance C of the MOS transistor Tx serving as a driver is large, and thus makes the amount of current flowing through the resistance R increase sharply.

Moreover, when the enable signal is turned to a high level again after it is maintained at a low level for a predetermined time, the output is disabled. At this time, the MOS transistors T1 and T5a are turned off and the MOS transistors T4 and T6a are turned on. This makes the gate voltage of the MOS transistor Tx reduce sharply, because the amount of current flowing, via the composite resistance of the on-state resistances of the MOS transistors T4, T6a, and T6b, from the gate capacitance C of the MOS transistor Tx is large, and thus makes the amount of current flowing through the resistance R reduce sharply. Moreover, when the data signal takes a high level, the MOS transistor T2 is in an off state and the MOS transistor T3 is in an on state. This makes the gate voltage of the MSO transistor Tx remain at a low level, whereby no current flows through the resistance R.

With this configuration, the output buffer circuit as shown in FIG. 1 is equivalent to an output buffer circuit shown in FIG. 2. That is, there are provided resistances R1a and R1b that receive, at their respective one ends, a direct-current voltage VDD applied thereto, resistances R2a and R2b having their respective one ends grounded, a switch SW1 connected between the other ends of the resistances R1a and R1b, a switch SW2 connected between the other ends of the resistances R2a and R2b, a three-contact switch SW3 having two contacts connected to the other ends of the resistances R1a and R2a, a switch SW4 connected, at one end thereof, to the remaining one contact of the switch SW3 and connected, at the other end thereof, to the gate of the MOS transistor Tx, and a MOS transistor Tx.

At this time, control is performed by the selection control signal to turn on/off the switches SW1 and SW2, switching control is performed by the data signal to switch the switch SW3 between two contacts, and control is performed by the enable signal to turn on/off the switch SW4. Specifically, when the selection control signal takes a low level, the switches SW1 and SW2 are turned on, whereby the composite resistance of the NOR gate NOx is made lower; when the selection control signal takes a high level, the switches SW1 and SW2 are turned off, whereby the composite resistance of the NOR gate NOx is made higher. Moreover, when the data signal takes a low level, the resistance R1a and the switch SW4 are connected together; when the data signal takes a high level, the resistance R2a and the switch SW4 are connected together. Furthermore, when the enable signal takes a low level, the switch SW4 is turned on; when the enable signal takes a high level, the switch SW4 is turned off.

Figure 3:
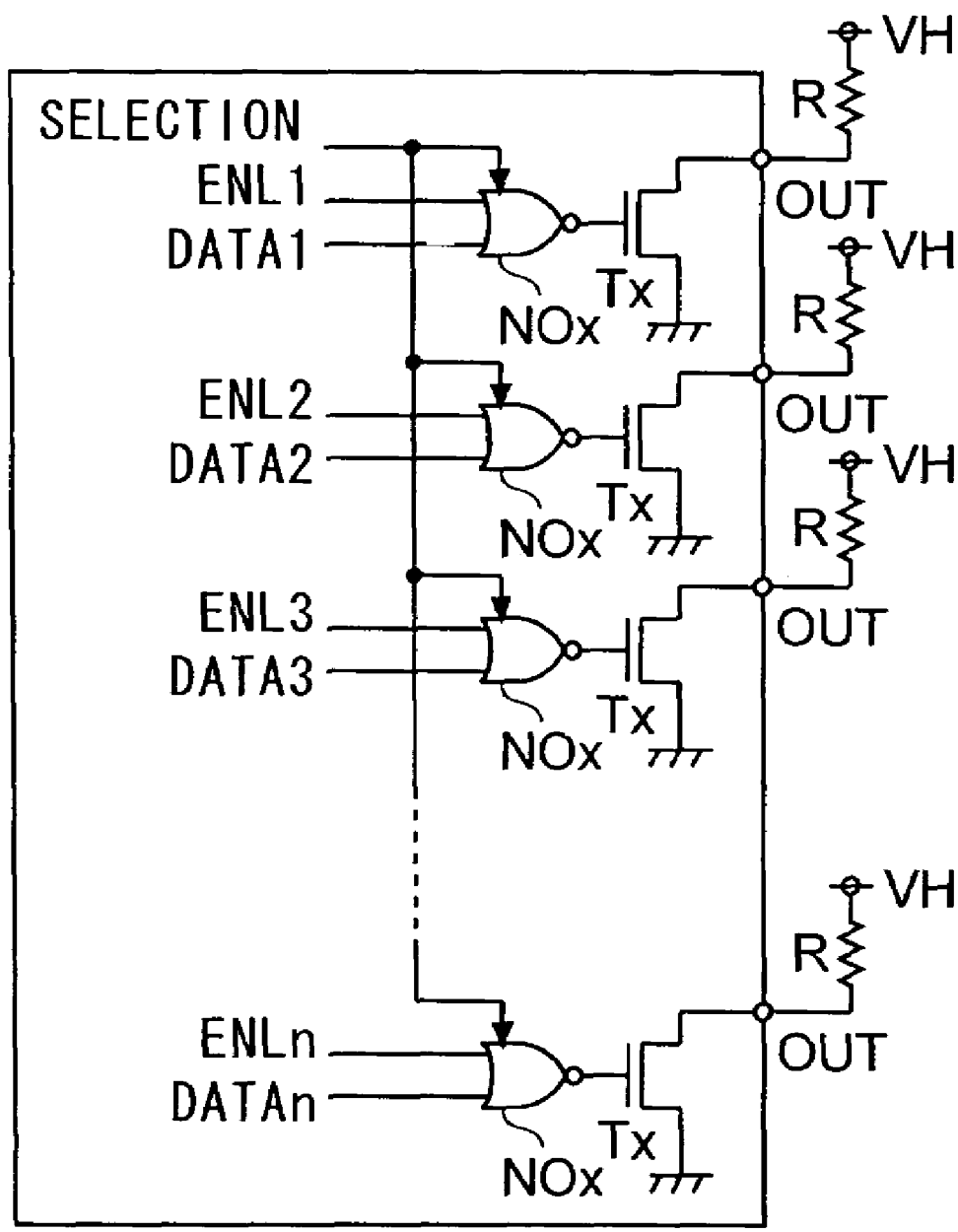
FIG. 3 is a circuit block diagram showing the configuration of the semiconductor integrated circuit device provided with the output buffer circuit of FIG. 1.
Figure 11:
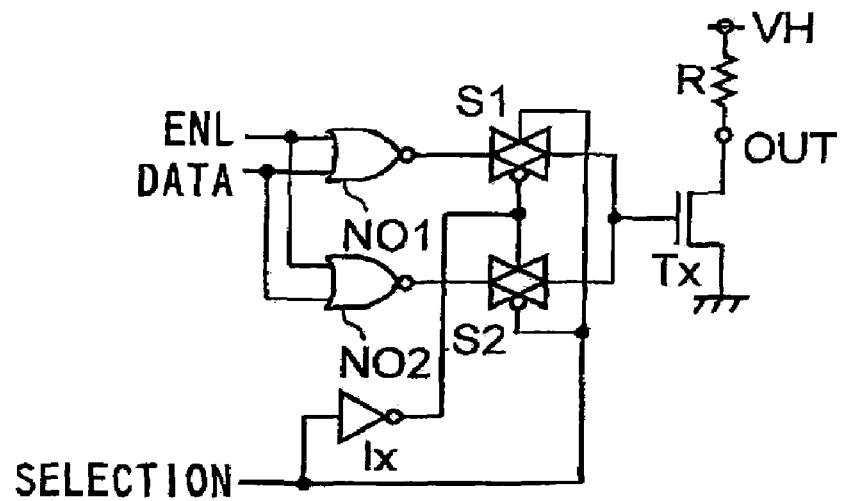
FIG. 11 is a circuit diagram showing the configuration of a conventional output buffer circuit.

Moreover, in a semiconductor integrated circuit device used as a driver of a thermal print head or the like, the number of output buffer circuits as shown in FIG. 1 is determined according to the number of print bits. Thus, when the number of print bits is n, the semiconductor integrated circuit device serving as a driver is provided, as shown in FIG. 3, with n NOR gates NOx of FIG. 1 and n MOS transistors Tx of FIG. 1 serving as a driver. Moreover, unlike the configuration of the conventional example shown in FIG. 11, the configuration as shown FIG. 1 eliminates the need to provide two selectable NOR gates and thus eliminates the need to provide a transistor switch for making a selection among these two NOR gates. This reduces the number of MOS transistors provided in one output buffer circuit and thereby reduces its footprint, resulting in further size reduction of the semiconductor integrated circuit device provided with a plurality of output buffer circuits, as shown in FIG. 3, as compared to the conventional one.

Figure 4:
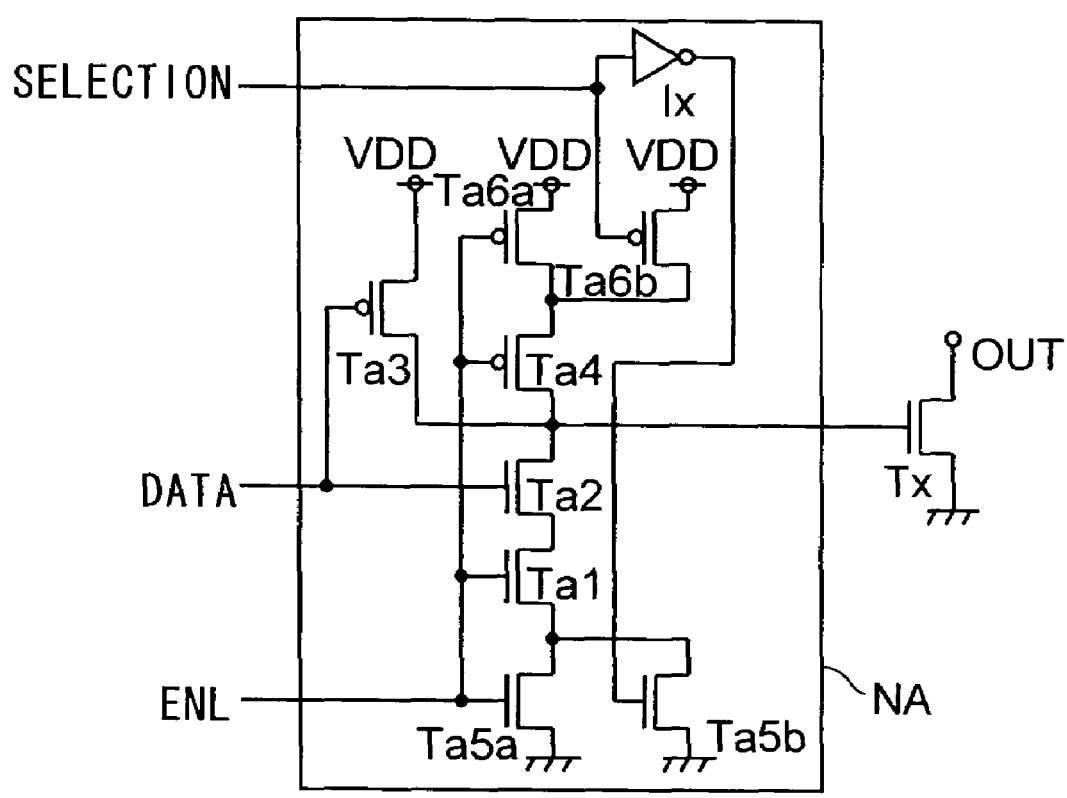
FIG. 4 is a circuit diagram showing the configuration of another output buffer circuit of the first embodiment.

This embodiment deals with a case where the NOR gate is used in the output buffer circuit. It should be understood, however, that a logic gate other than the NOR gate may be provided instead. For example, when a NAND gate NA is provided instead of the NOR gate NOx, an example of this configuration is shown in FIG. 4. In that case, the NAND gate NA is provided with N channel MOS transistors Ta5a, Ta1, and Ta2 connected in series between the ground potential and the gate of the MOS transistor Tx, an N channel MOS transistor Ta5b connected in parallel to the MOS transistor Ta5a, P channel MOS transistors Ta4 and Ta6a connected in series between the voltage VDD and the gate of the MOS transistor Tx, a P channel MOS transistor Ta6b connected in parallel to the MOS transistor Ta6a, and a P channel MOS transistor Ta3 connected in parallel to the circuit composed of the MOS transistors Ta4, Ta6a, and Ta6b.

The MOS transistor Ta1, Ta4, Ta5a, and Ta6a receive an enable signal at their gates, the MOS transistors Ta2 and Ta3 receive a data signal at their gates, the MOS transistor Ta5b receives at its gate a selection control signal inverted by the inverter Ix, and the MOS transistor Ta6b receives a selection control signal at its gate.

Thus, when the selection control signal takes a low level, the MOS transistors Ta5b and Ta6b are turned on. This makes the composite resistance within the NAND gate NA lower and thus causes the output of the NAND gate NA to vary sharply. This causes the gate voltage to be fed to the driver MOS transistor driven by the output of the NAND gate NA to vary sharply. Moreover, when the selection control signal takes a high level, the MOS transistors Ta5b and Ta6b are turned off. This makes the composite resistance within the NAND gate NA higher and thus causes the output of the NAND gate NA to vary gently. This causes the gate voltage to be fed to the driver MOS transistor driven by the output of the NAND gate NA to vary gently. It is to be noted that the driver MOS transistor may be a P channel MOS transistor.

As described above, this embodiment deals with a semiconductor integrated circuit device that is provided with a driver MOS transistor and a logic gate whose output is connected to the gate of the driver MOS transistor to drive it, and that makes the composite resistance within the logic gate vary according to a selection control signal. It should be understood, however, that the logic gate is not limited to the NOR gate NOx and the NAND gate NA as described above.

Moreover, in the NOR gate NOx and the NAND gate NA as described above, the on-state resistances of the MOS transistors T5b and T6b or the on-state resistances of the MOS transistors Ta5b and Ta6b can be adjusted individually. This makes it possible to make an adjustment so that the increase and reduction of the output from the output buffer circuit occur with different rates of change.

Moreover, in the NOR gate NOx and the NAND gate NA as described above, there may be provided MOS transistors connected in parallel to the MOS transistors T5b and T6b or the MOS transistors Ta5b and Ta6b, and these MOS transistors may have different on-state resistances. In that case, among these MOS transistors connected in parallel to the MOS transistors T5b and T6b or the MOS transistors Ta5b and Ta6b, the one to be turned on is set by the selection control signal. In this way, using the selection control signal to set, among these MOS transistors connected in parallel to the MOS transistors T5b and T6b or the MOS transistors Ta5b and Ta6b, the one to be turned on makes it possible to build an output buffer circuit that can adjust the output so as to vary according to a plurality of operation frequencies.

Second Embodiment

Figure 5:
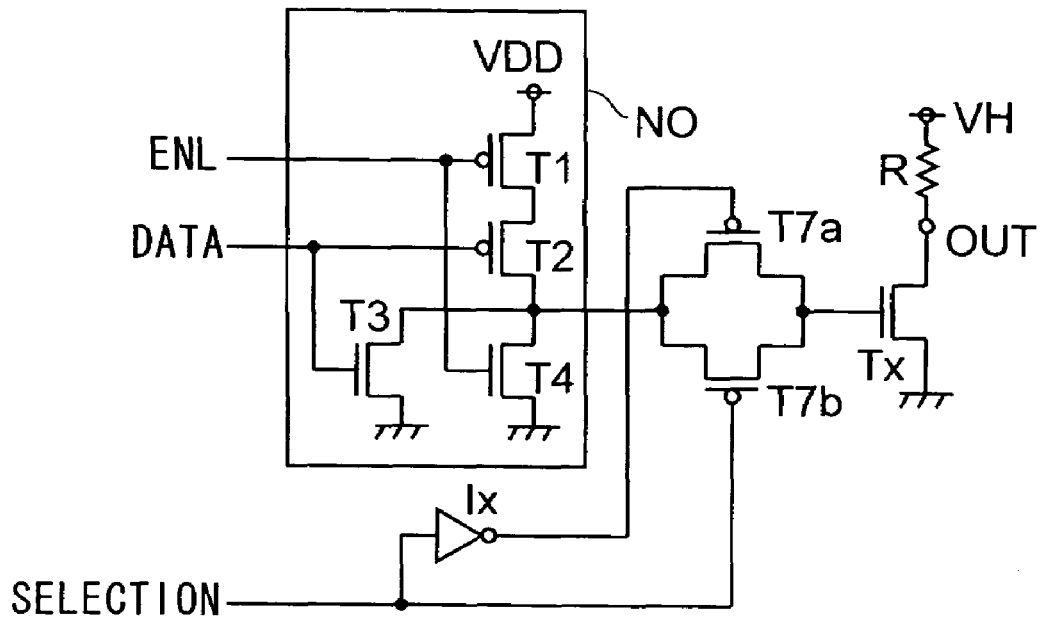
FIG. 5 is a circuit diagram showing the configuration of the output buffer circuit of a second embodiment.
Figure 6:
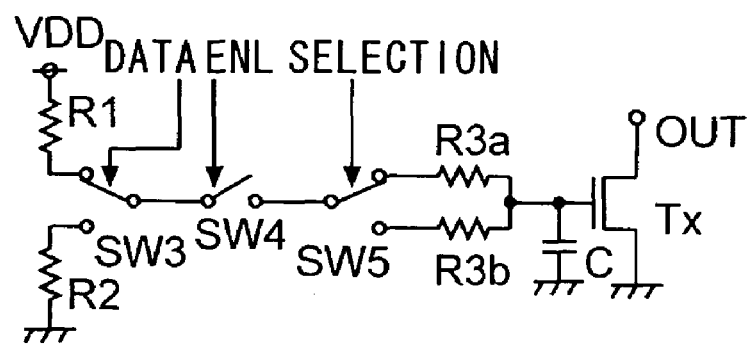
FIG. 6 is a circuit diagram showing the equivalent circuit of the output buffer circuit of FIG. 5.

A second embodiment of the present invention will be described with reference to the accompanying drawings. FIG. 5 is a circuit diagram showing the configuration of the output buffer circuit of the second embodiment, and FIG. 6 is a circuit diagram showing the equivalent circuit of the output buffer circuit of FIG. 5.

The output buffer circuit of FIG. 5 is provided with a NOR gate NO composed of a P channel MOS transistor T1 and an N channel MOS transistor T4 that receive an enable signal at their gates, a P channel MOS transistor T2 and an N channel MOS transistor T3 that receives a data signal at their gates, and P channel MOS transistors T7a and T7b that receive the output of the NOR gate NO at their sources and is connected in parallel. Moreover, the output buffer circuit of FIG. 5 is provided with an N channel MOS transistor Tx having its gate connected to the node at which the drains of the MOS transistors T7a and T7b are connected together and serving as a driver.

Figure 10:
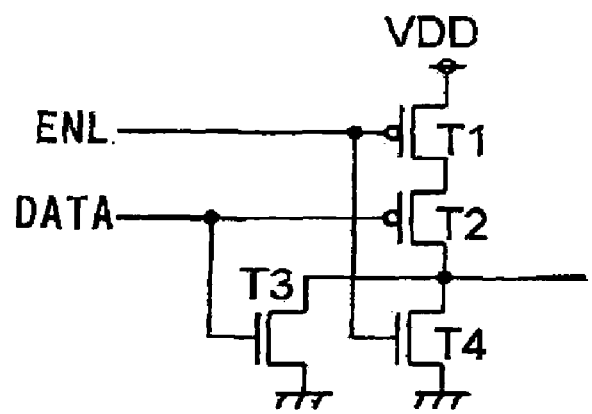
FIG. 10 is a circuit diagram showing the configuration of the NOR gate provided in the output buffer circuit of FIG. 9.

In this output buffer circuit, the MOS transistor T7a receives at its gate a selection control signal inverted by an inverter Ix, and the MOS transistor T7b receives a selection control signal at its gate. Moreover, as in the conventional example, the NOR gate NO composed of the MOS transistors T1 to T4 has the same connection relationship as that shown in FIG. 10. Thus, the node at which the sources of the MOS transistors T7a and T7b are connected is connected to the node at which the drains of the MOS transistors T2 to T4 are connected.

Furthermore, the MOS transistors T1 to T4, T7a, and T7b are set so that the on-state resistance of the MOS transistor T7a is made higher than the on-state resistance of the MOS transistors T1 to T4 and T7b. That is, they may be set so that the gate width of the MOS transistor T7a is made narrower than that of the MOS transistors T1 to T4 and T7b. Alternatively, they may be set so that the gate length of the MOS transistor T7a is made longer than that of the MOS transistors T1 to T4 and T7b.

In this output buffer circuit, switching control is performed to turn on/off the MOS transistors T7a and T7b by switching the selection control signal from one level to another. Specifically, when the selection control signal takes a high level, the MOS transistor T7a that receives at its gate a selection control signal inverted into a low level by the inverter Ix is turned on, and the MOS transistor T7b that receives a high level selection control signal at its gate is turned off. On the other hand, when the selection control signal takes a low level, the MOS transistor T7a that receives at its gate a selection control signal inverted into a high level by the inverter Ix is turned off, and the MOS transistor T7b that receives a low level selection control signal at its gate is turned on.

Thus, when the operation frequency is low, the output buffer circuit of FIG. 5 operates in the following manner to cause the gate voltage of the MOS transistor Tx serving as a driver to vary gently. The output buffer circuit makes the selection control signal take a high level, thereby turning on the MOS transistor T7a and turning off the MOS transistor T7b. At this time, if a low level data signal is fed, when the enable signal is turned to a low level and then output from the driver is enabled, the MOS transistors T1, T2, and T7a are in an on state and the MOS transistors T3, T4, and T7b are in an off state. This makes the gate voltage of the MOS transistor Tx increase gently, because the amount of current flowing, via the composite resistance of the on-state resistances of the MOS transistors T1, T2, and T7a, through the gate capacitance C of the MOS transistor Tx serving as a driver is small, and thus makes the amount of current flowing through the resistance R increase gently.

Moreover, when the enable signal is turned to a high level again after it is maintained at a low level for a predetermined time, the output is disabled. At this time, the MOS transistor T1 is turned off and the MOS transistors T4 is turned on. This makes the gate voltage of the MOS transistor Tx decrease gently, because the amount of current flowing, via the composite resistance of the on-state resistances of the MOS transistors T4 and T7a, from the gate capacitance C of the MOS transistor Tx is small, and thus makes the amount of current flowing through the resistance R decrease gently. Moreover, when the data signal takes a high level, the MOS transistor T2 is in an off state and the MOS transistor T3 is in an on state. This makes the gate voltage of the MSO transistor Tx remain at a low level, whereby no current flows through the resistance R.

On the other hand, when the operation frequency is high, the output buffer circuit operates in the following manner to cause the gate voltage of the MOS transistor Tx serving as a driver to vary sharply. The output buffer circuit makes the selection control signal take a low level, thereby turning off the MOS transistor T7a and turning on the MOS transistor T7b. At this time, if a low level data signal is fed, when the enable signal is turned to a low level and then output from the driver is enabled, the MOS transistors T1, T2, and T7b are in an on state and the MOS transistors T3, T4, and T7a are in an off state. This makes the gate voltage of the MOS transistor Tx increase sharply, because the amount of current flowing, via the composite resistance of the on-state resistances of the MOS transistors T1, T2, and T7b, through the gate capacitance C of the MOS transistor Tx serving as a driver is large, and thus makes the amount of current flowing through the resistance R increase sharply.

Moreover, when the enable signal is turned to a high level again after it is maintained at a low level for a predetermined time, the output is disabled. At this time, the MOS transistor T1 is turned off and the MOS transistors T4 is turned on. This makes the gate voltage of the MOS transistor Tx reduce sharply, because the amount of current flowing, via the composite resistance of the on-state resistances of the MOS transistors T4 and T7b, from the gate capacitance C of the MOS transistor Tx is large, and thus makes the amount of current flowing through the resistance R reduce sharply. Moreover, when the data signal takes a high level, the MOS transistor T2 is in an off state and the MOS transistor T3 is in an on state. This makes the gate voltage of the MSO transistor Tx remain at a low level, whereby no current flows through the resistance R.

With this configuration, the output buffer circuit as shown in FIG. 5 is equivalent to an output buffer circuit shown in FIG. 6. That is, there are provided a resistance R1 that receives, at one end thereof, a direct-current voltage VDD (a power supply voltage) applied thereto, a resistance R2 having one end grounded, a three-contact switch SW3 having two contacts connected to the other ends of the resistances R1 and R2, a switch SW4 connected, at one end thereof, to the remaining one contact of the switch SW3, a three-contact switch SW5 having one contact connected to the other end of the switch SW4, resistances R3a and R3b connected, at their one ends, to the remaining two contacts of the switch SW5, and a MOS transistor Tx having its gate connected to the node at which the other ends of the resistances R3a and R3b are connected. Of the resistances R3a and R3b, the resistance of the resistance R3a is higher than that of the resistance R3b.

At this time, switching control is performed by the data signal to switch the switch SW3 between two contacts, control is performed by the enable signal to turn on/off the switch SW4, and switching control is performed by the selection control signal to switch the switch SW5 between two contacts. Specifically, when the selection control signal takes a low level, the resistance R3b having a lower resistance and the switch SW4 are connected together by the switch SW5. When the selection control signal takes a high level, the resistance R3a having a higher resistance and the switch SW4 are connected together by the switch SW5. When the data signal takes a low level, the resistance R1 and the switch SW4 are connected together; when the data signal takes a high level, the resistance R2 and the switch SW4 are connected together. When the enable signal takes a low level, the switch SW4 is turned on; when the enable signal takes a high level, the switch SW4 is turned off.

Figure 7:
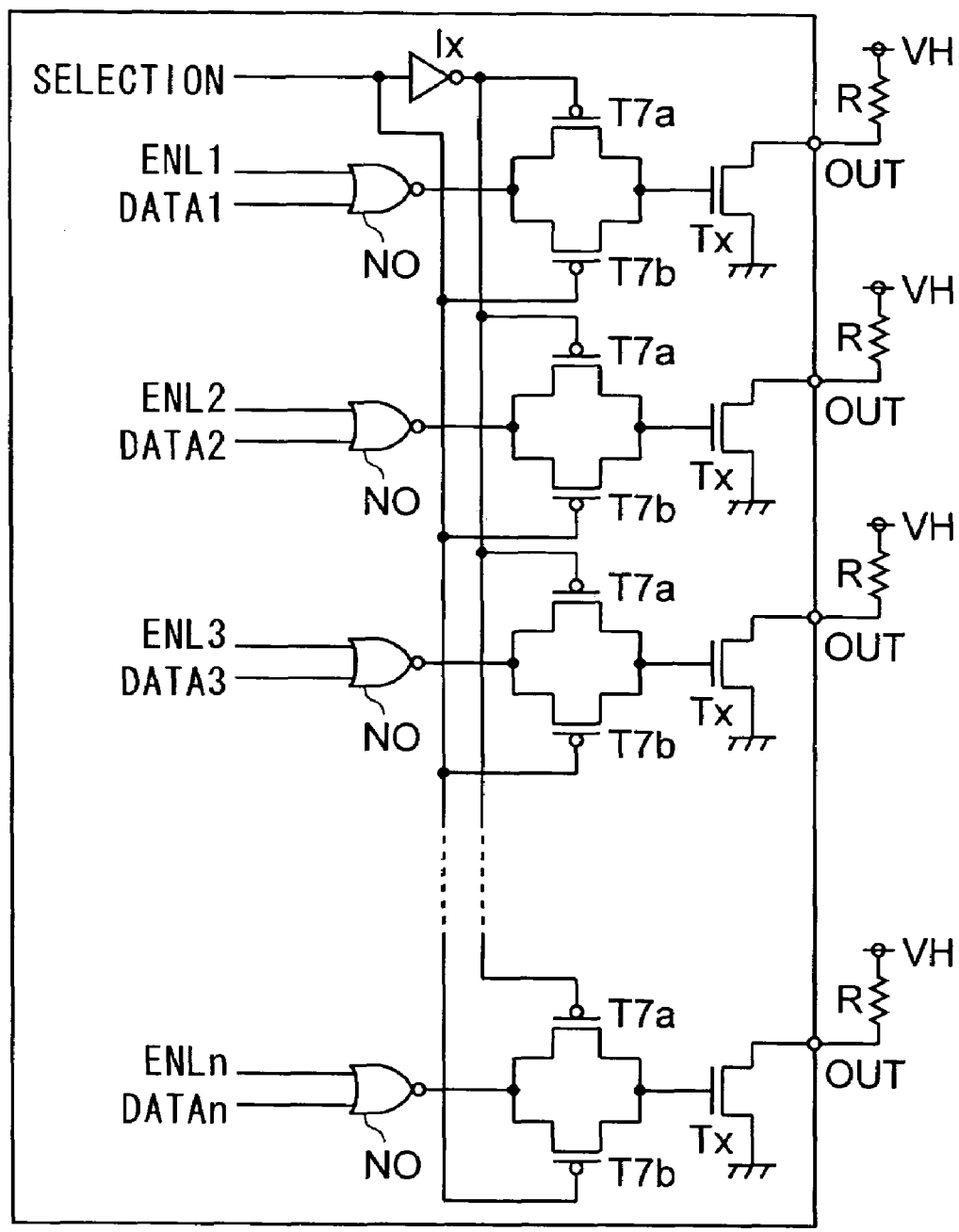
FIG. 7 is a circuit block diagram showing the configuration of the semiconductor integrated circuit device provided with the output buffer circuit of FIG. 5.

Moreover, in a semiconductor integrated circuit device used as a driver of a thermal print head or the like, the number of output buffer circuits as shown in FIG. 5 is determined according to the number of print bits. Thus, when the number of print bits is n, the semiconductor integrated circuit device serving as a driver is provided, as shown in FIG. 7, with n NOR gates NOx of FIG. 5, n MOS transistors Tx, n MOS transistors T7a, and n MOS transistors T7b of FIG. 5. Moreover, the number of inverters Ix provided in this semiconductor integrated circuit device is one. Furthermore, the configuration as shown in FIG. 5 requires a much smaller number of MOS transistors constituting one output buffer circuit than those required by the configuration as shown in FIG. 1. This reduces the number of MOS transistors provided in one output buffer circuit and thereby reduces its footprint as compared to that of the first embodiment, resulting in further size reduction of the semiconductor integrated circuit device provided with a plurality of output buffer circuits, as shown in FIG. 7, as compared to that of the first embodiment.

Figure 12:
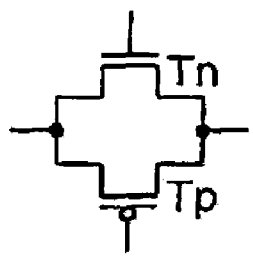
FIG. 12 is a circuit diagram showing the configuration of the transistor switch provided in the output buffer circuit of FIG. 11.
Figure 13:
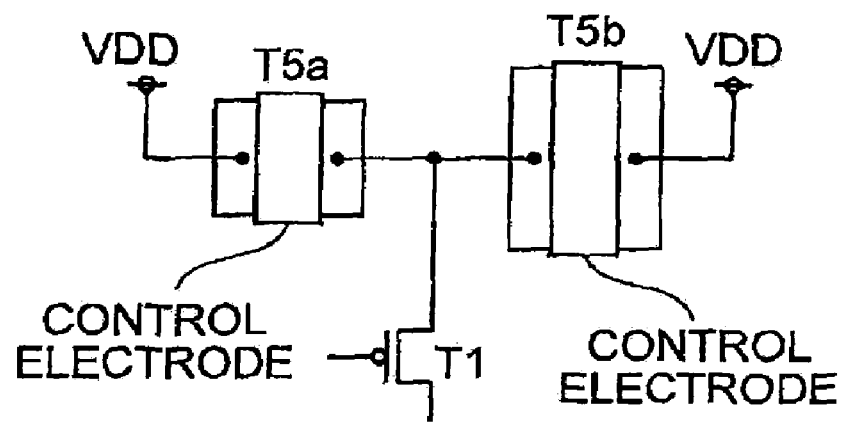
FIG. 13 is a schematic diagram showing the configuration of the transistor of the output circuit of the first embodiment.
Figure 14:
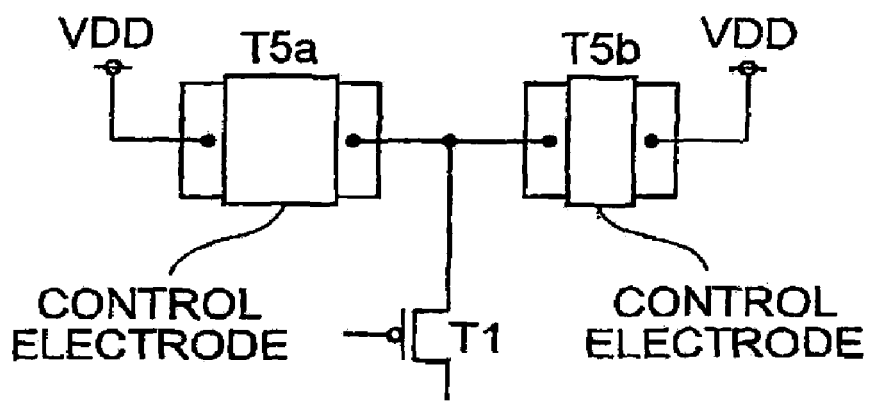
FIG. 14 is a schematic diagram showing another configuration of the transistor of the output buffer circuit of the first embodiment.
Figure 15:
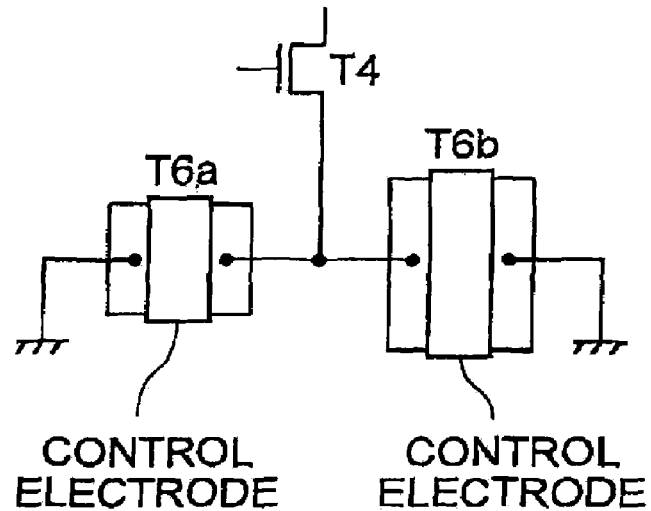
FIG. 15 is a schematic diagram showing the configuration of the transistor of the output circuit of the first embodiment.
Figure 16:
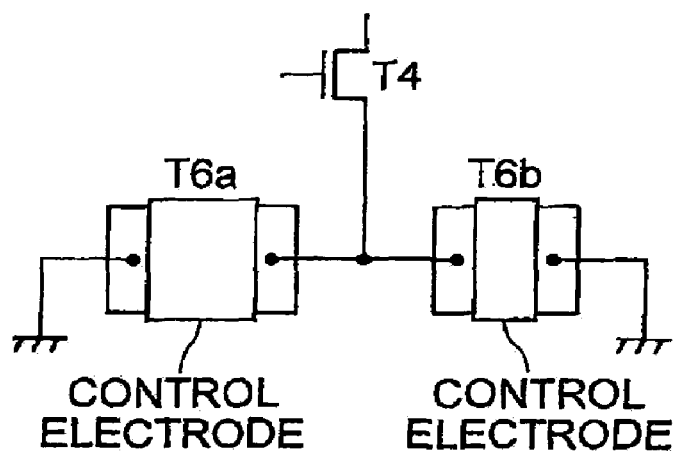
FIG. 16 is a schematic diagram showing another configuration of the transistor of the output buffer circuit of the first embodiment.
Figure 17:
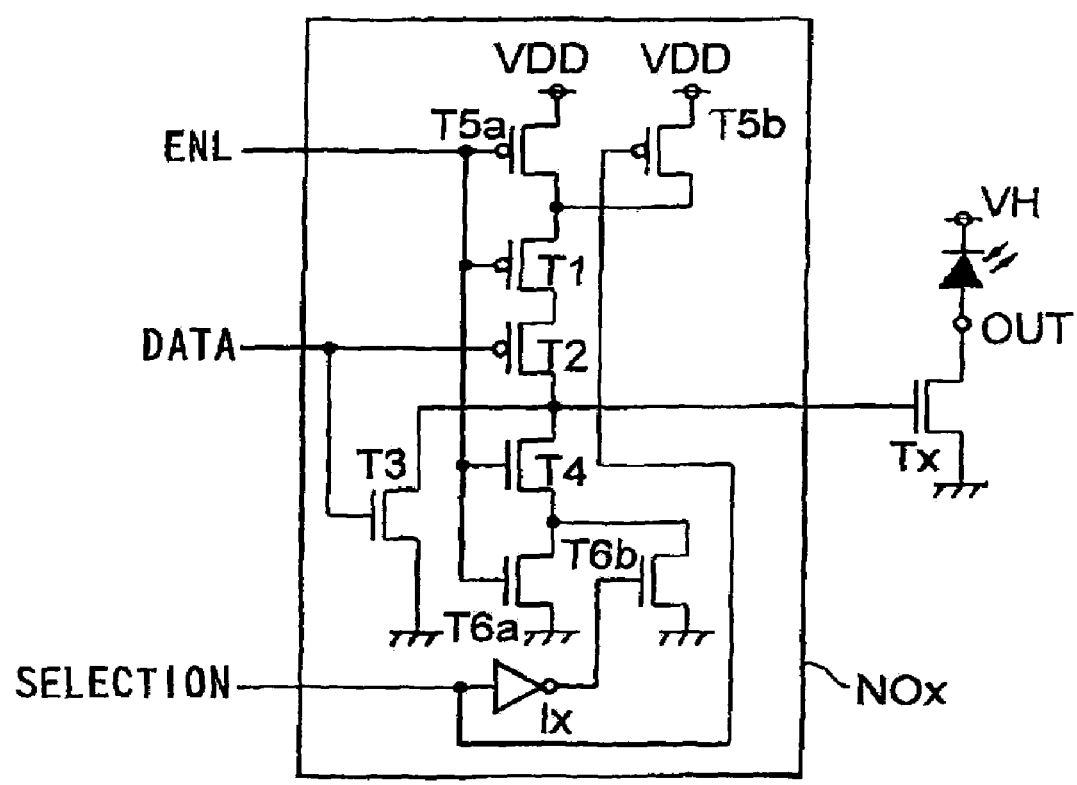
FIG. 17 is a circuit diagram showing another configuration of the output buffer circuit of the first embodiment.
Figure 18:
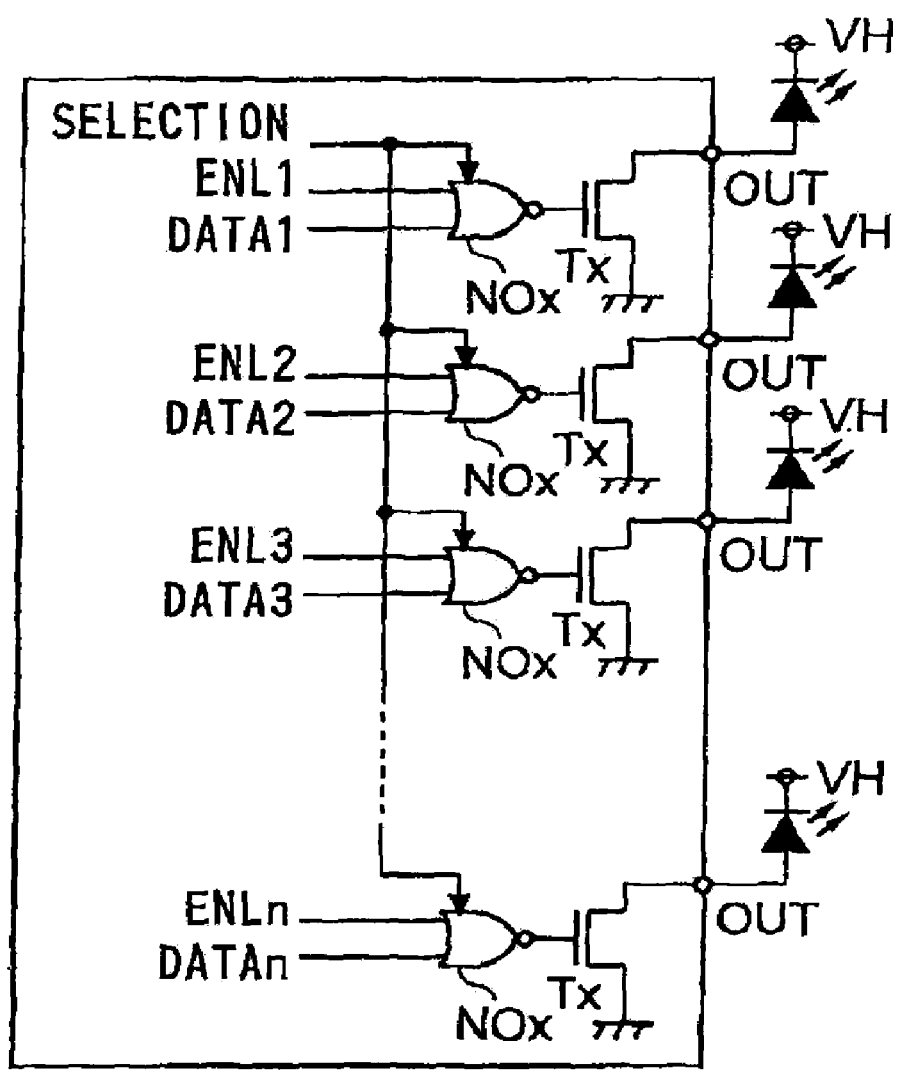
FIG. 18 is a circuit block diagram showing another configuration of the semiconductor integrated circuit device provided with the output buffer circuit of the first embodiment.
Figure 19:
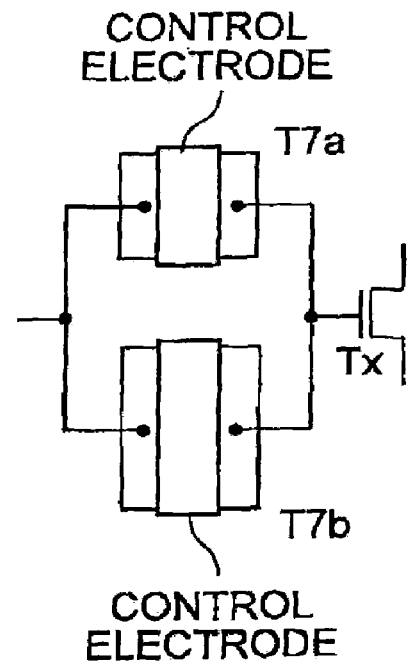
FIG. 19 is a schematic diagram showing the configuration of the transistor of the output buffer circuit of the second embodiment.
Figure 20:
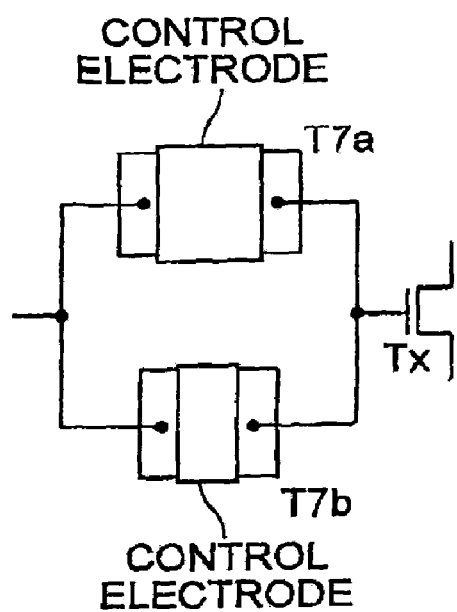
FIG. 20 is a schematic diagram showing another configuration of the transistor of the output buffer circuit of the second embodiment.
Figure 21:
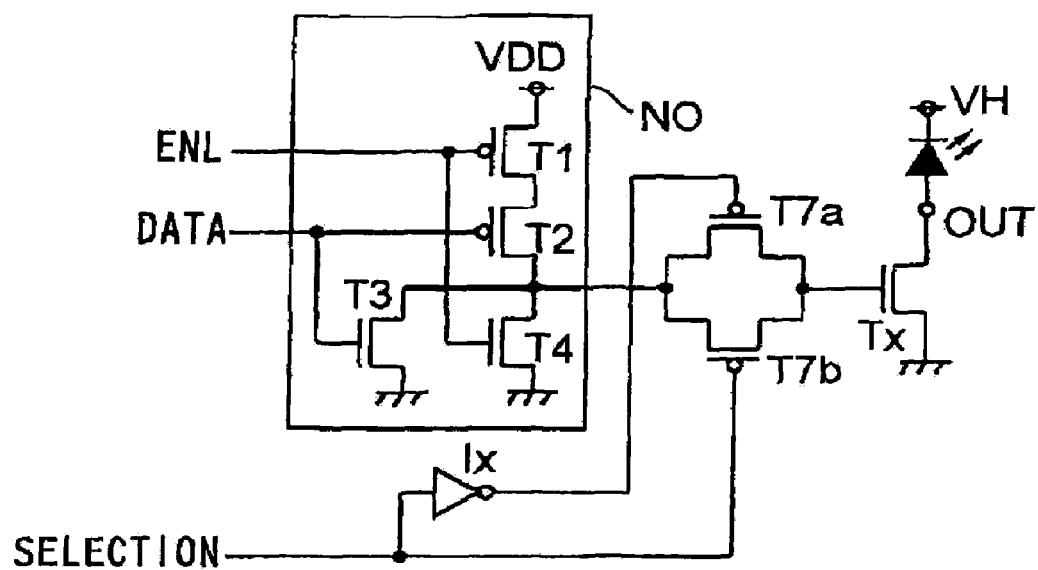
FIG. 21 is a schematic diagram showing another configuration of the output buffer circuit of the second embodiment.
Figure 22:
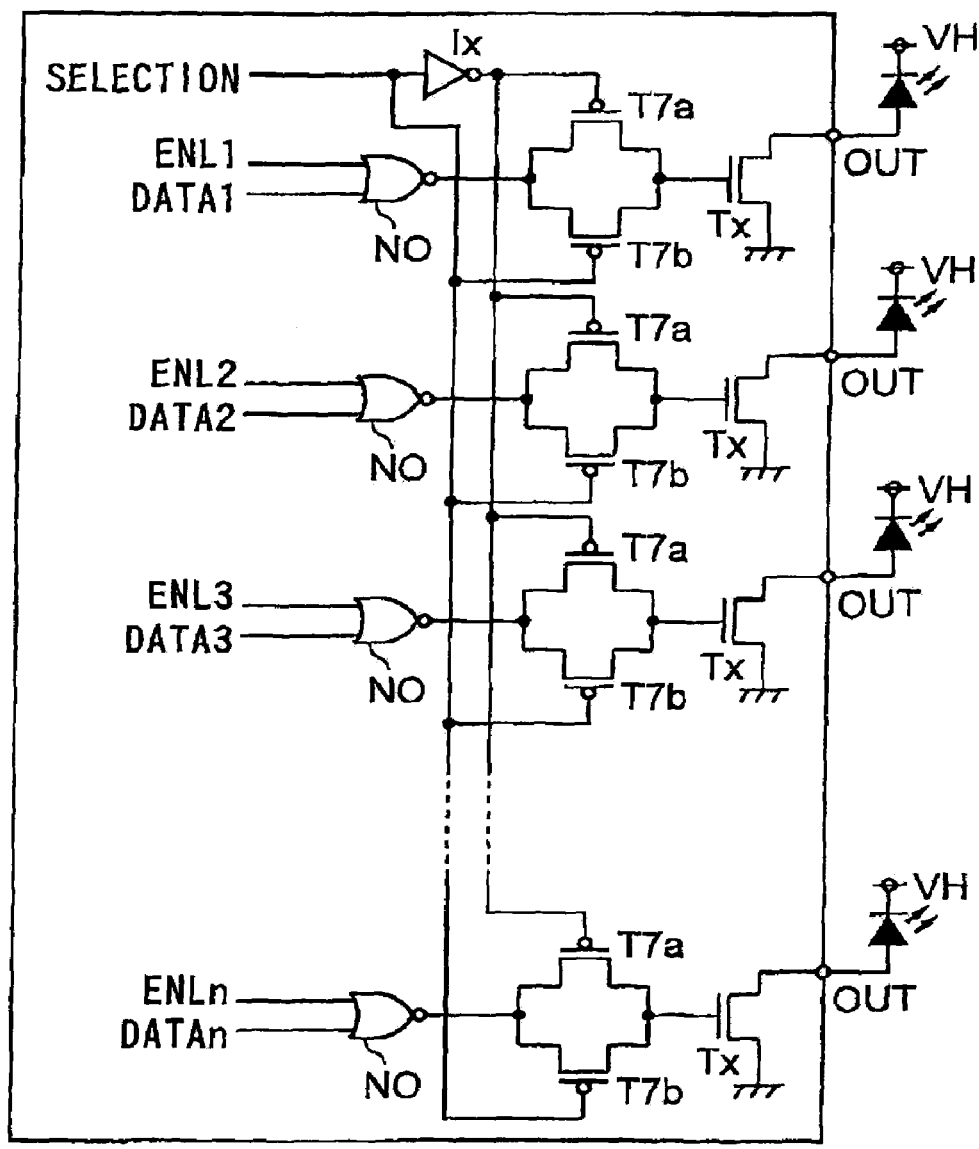
FIG. 22 is a circuit block diagram showing another configuration of the semiconductor integrated circuit device provided with the output buffer circuit of the second embodiment.

This embodiment deals with a case where the P channel MOS transistors T7a and T7b having different on-state resistances are connected in parallel between the output of the NOR gate NO and the gate of the MOS transistor Tx. It should be understood, however, that they may be replaced with two N channel MOS transistors having different on-state resistances connected in parallel, or two transistor switches, as shown in FIG. 12, having different on-state resistances connected in parallel. Moreover, this embodiment deals with a case where the output from the NOR gate is fed to the gate of the driver MOS transistor Tx to drive it. As in the first embodiment, however, the logic gate is not limited to the NOR gate, but may be of any other type.

Moreover, this embodiment deals with a case where the P channel MOS transistors T7a and T7b having different on-state resistances are connected in parallel between the output of the NOR gate NO and the gate of the MOS transistor Tx. The number of MOS transistors provided is not limited to two; that is, three or more MOS transistors having different on-state resistances connected in parallel may be provided. In that case, among a plurality of MOS transistors connected in parallel between the output of the NOR gate NO and the gate of the MOS transistor Tx, the one to be turned on is set by the selection control signal. In this way, using the selection control signal to set, among a plurality of MOS transistors connected in parallel between the output of the NOR gate NO and the gate of the MOS transistor Tx, the one to be turned on makes it possible to build an output buffer circuit that can adjust the output so as to vary according to a plurality of operation frequencies.

Figure 8:
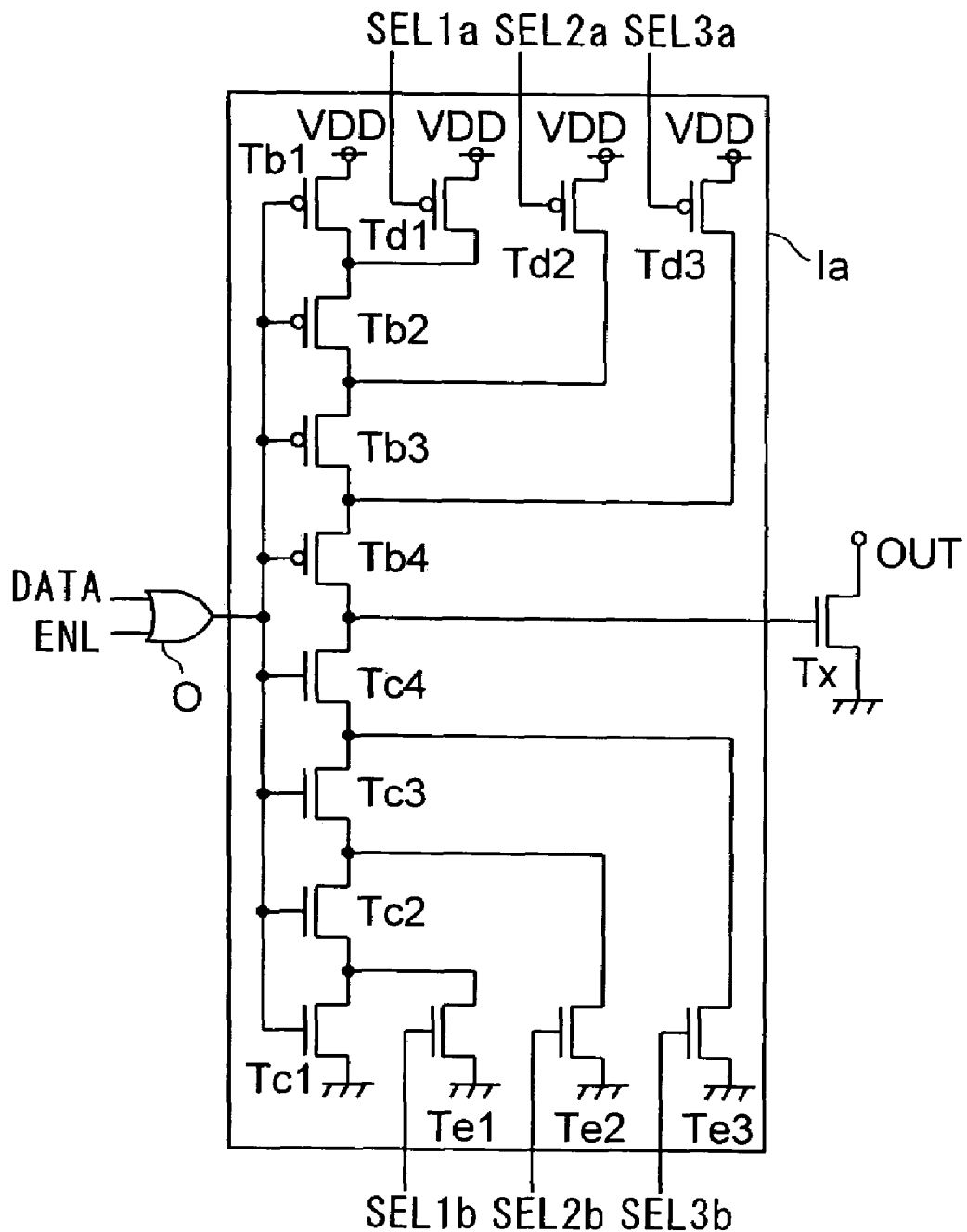
FIG. 8 is a circuit block diagram showing another configuration of the output buffer circuit provided in the semiconductor integrated circuit device embodying the invention.
Figure 9:
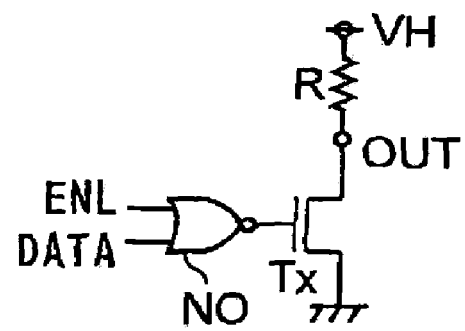
FIG. 9 is a circuit diagram showing the configuration of a conventional output buffer circuit.

Moreover, as shown in FIG. 8, an output buffer circuit may be composed, unlike those described in the first and second embodiments, of an OR gate O that receives an enable signal and a data signal, an inverter Ia that receives the output from the OR gate O, and a driver MOS transistor Tx that receives at its gate the output from the inverter Ia. In that case, the inverter Ia is provided with P channel MOS transistors Tb1 to Tb4 and N channel MOS transistors Tc1 to Tc4 having their gates connected to the output of the OR gate O, P channel MOS transistors Td1 to Td3 that receives at their sources a direct-current voltage VDD applied thereto, and N channel MOS transistors Te1 to Te3 having their sources grounded.

The MOS transistor Tb1 receives at its source the direct-current voltage VDD applied thereto, the source of the MOS transistor Tb2 is connected to the drains of the MOS transistors Tb1 and Td1, the source of the MOS transistor Tb3 is connected to the drains of the MOS transistors Tb2 and Td2, and the source of the MOS transistor Tb4 is connected to the drains of the MOS transistors Tb3 and Td3. Moreover, the source of the MOS transistor Tc1 is grounded, the source of the MOS transistor Tc2 is connected to the drains of the MOS transistors Tc1 and Te1, the source of the MOS transistor Tc3 is connected to the drains of the MOS transistors Tc2 and Te2, and the source of the MOS transistor Tc4 is connected to the drains of the MOS transistors Tc3 and Te3.

Furthermore, the node at which the drains of the MOS transistors Tb4 and Tc4 are connected serves as the output end of the inverter Ia, and the output therefrom is inputted to the gate of the MOS transistor Tx. Moreover, the MOS transistors Td1 to Td3 receive the selection control signals SEL1a to SEL3a at their gates, respectively, and the MOS transistors Te1 to Te3 receive the selection control signals SEL1b to SEL3b at their gates, respectively. Specifically, when the selection control signals SEL1a to SEL3a take a low level, the MOS transistors Td1 to Td3 are turned on; when the selection control signals SEL1b to SEL3b take a high level, the MOS transistors Te1 to Te3 are turned on.

Thus, making the on-state resistance of the MOS transistors Td1 to Td3 and Te1 to Te3 lower than the on-state resistance of the MOS transistors Tb1 to Tb4 and Tc1 to Tc4 makes it possible to adjust the power supply voltage-side and ground-side composite resistances within the inverter Ia in more than one way by controlling the values of the selection control signals SEL1a to SEL3a and SEL1b to SEL3b. Accordingly, as in the second embodiment, the OR gate O does not require the switching of the composite resistances, making it possible to use the conventional OR gate. In this configuration, an OR gate is used as a logic gate whose output is connected to the input of the inverter Ia. In practice, however, an AND gate, a NAND gate, a NOR gate, and the like may be used instead.

Moreover, all the embodiments as described above deal with cases where a semiconductor integrated circuit device provided with an output buffer circuit is used in a thermal print head. However, such a semiconductor integrated circuit device provided with an output buffer circuit can be used for another application, such as an optical print head having an output terminal connected to a light-emitting device.

INDUSTRIAL APPLICABILITY

According to the present invention, it is possible to switch the composite resistances within a logic gate, or there is provided a plurality of transistor switches that can switch the values of the resistance between the logic gate and the control electrode of a driver transistor. This eliminates the need to use a logic gate according to the operation frequency as used in the conventional example, and the need to ground a plurality of logic gates according to a plurality of operation frequencies. This makes it easy to switch the characteristics of the logic gate according to the operation frequency, and eliminates the need to increase the device size. Furthermore, it is possible to achieve size reduction of a semiconductor integrated circuit device that can perform switching according to a plurality of operation frequencies.

The invention claimed is:

1. A semiconductor integrated circuit device comprising an output buffer circuit composed of a logic gate that receives data and a driver transistor that receives, at a control electrode thereof, an output from the logic gate and that is driven according to the output from the logic gate, wherein an output control signal that controls an output operation of the driver transistor is inputted to the logic gate;

wherein the logic gate includes a resistance value switching transistor that receives a selection control signal that varies magnitude of a composite resistance of an on-state resistance of a transistor constituting the logic gate, and that can be switched on/off by the selection control signal, a first transistor that receives the output control signal at a control electrode thereof and a direct-current voltage at a first electrode thereof;

a switch that is switched on/off by the output control signal and that electrically connects/disconnects a second electrode of the first transistor and the control electrode of the driver transistor; and the resistance value switching transistor receiving the direct-current voltage at a first electrode thereof, having a second electrode connected to a node at which the second electrode of the first transistor and the switch are connected, and having an on-state resistance lower than the on-state resistance of the first transistor,
wherein the resistance value switching transistor is switched on/off by the selection control signal to switch a rate of change of an output of the driver output transistor.

2. The semiconductor integrated circuit device according to claim 1,
wherein, when an operation frequency of the output buffer circuit is high, the resistance value switching transistor is turned on, and
wherein, when the operation frequency of the output buffer circuit is low, the resistance value switching transistor is turned off 3. The semiconductor integrated circuit device according to claim 1,
wherein the first transistor and the resistance value switching transistor are MOS transistors, and
wherein a gate width of the first transistor is made narrower than a gate width of the resistance value switching transistor, or a gate length of the first transistor is made longer than a gate length of the resistance value switching transistor.

4. The semiconductor integrated circuit device according to claim 1,
wherein an output value determination signal that determines an output from the driver transistor is inputted to the logic gate and the output control signal disables/enables the output operation of the driver transistor,
wherein the logic gate includes
the first transistor, the switch, and the resistance value switching transistor that use the direct-current voltage as a power supply voltage,
the first transistor, the switch, and the resistance value switching transistor that use the direct-current voltage as a ground voltage, and
a selection switch that selects among outputs from the switch on a side of a power supply voltage and from the switch on a side of a ground voltage according to a value of the output value determination signal, and outputs the selected output to the control electrode of the driver transistor.

5. The semiconductor integrated circuit device according to claim 4,
wherein the first transistor and the resistance value switching transistor which are on a side of the power supply voltage are P channel MOS transistors, and
wherein the first transistor and the resistance value switching transistor which are on a side of the ground voltage are N channel MOS transistors.

6. The semiconductor integrated circuit device according to claim 1, wherein the switch is a second transistor receiving the output control signal at a control electrode thereof, having a first electrode connected to the second electrode of the first transistor, and having a second electrode connected to the control electrode of the driver transistor.

7. The semiconductor integrated circuit device according to claim 1,
wherein the logic gate includes
a plurality of first transistors that have control electrodes serving as an input and that are connected in series between the direct-current voltage and the output of the logic gate, and
a plurality of said resistance value switching transistor receiving at first electrodes thereof the direct-current voltage applied thereto, having second electrodes connected to respective second electrodes of the first transistors, and having an on-state resistance lower than an on-state resistance of the first transistors.

8. A semiconductor integrated circuit device comprising an output buffer circuit composed of a logic gate that receives data and a driver transistor that receives, at a control electrode thereof, an output from the logic gate and that is driven according to the output from the logic gate,
wherein there is provided, within the output buffer circuit, a transistor switch having a plurality of transistors that have different on-state resistances and that are connected in parallel between the output of the logic gate and the control electrode of the driver transistor, and
wherein one of the plurality of transistors is turned on to switch a rate of change of an output of the driver output transistor,
wherein, when the transistor switch is composed of a first transistor and a second transistor and an on-state resistance of the first transistor is higher than an on-state resistance of the second transistor,
if an operation frequency of the output buffer circuit is low, the first transistor switch is turned on and the second transistor switch is turned off, and
if the operation frequency of the output buffer circuit is high, the first transistor switch is turned off and the second transistor switch is turned on.

9. The semiconductor integrated circuit device according to claim 8,
wherein, by making MOS transistors constituting each transistor switch have different gate widths and different gate lengths, the transistor switches are made to have different on-state resistances.

10. The semiconductor integrated circuit device according to claim 8,
wherein there are provided a plurality of said output buffer circuit.

11. The semiconductor integrated circuit device according to claim 8,
wherein a drive current of the driver transistor is fed to a resistance connected, at one end thereof, to the driver transistor of the output buffer circuit and receiving, at an other end thereof, a direct-current voltage applied thereto.

12. The semiconductor integrated circuit device according to claim 8,
wherein, by causing a drive current of the driver transistor to flow through a light-emitting device connected, at one end thereof, to the driver transistor of the output buffer circuit and receiving, at an other end thereof, a direct-current voltage applied thereto, the light-emitting device is made to emit light.

13. A print head comprising:
the semiconductor integrated circuit device of claim 10; and
a plurality of resistances that are each connected, at one end thereof, to the driver transistor of the plurality of said output buffer circuit provided in the semiconductor integrated circuit device and receiving, at an other end thereof, a direct-current voltage applied thereto, and
wherein a drive current of the drive transistor flows through the resistances, and the resistances produce heat.

14. A print head comprising:
the semiconductor integrated circuit of claim 10; and
a plurality of light-emitting devices that are each connected, at one end thereof, to the driver transistor of the plurality of said output buffer circuit provided in the semiconductor integrated circuit and receiving, at an other end thereof, a direct-current voltage applied thereto, and wherein a drive current of the driver transistor flows through the light-emitting devices, and the light-emitting devices emit light.

15. The semiconductor integrated circuit device according to claim 8, wherein the direct-current voltage is a ground voltage.

* * * * *